(12) United States Patent
Hsieh

(10) Patent No.: US 8,686,468 B2
(45) Date of Patent: Apr. 1, 2014

(54) SEMICONDUCTOR POWER DEVICE HAVING WIDE TERMINATION TRENCH AND SELF-ALIGNED SOURCE REGIONS FOR MASK SAVING

(71) Applicant: Force Mos Technology Co., Ltd., New Taipei (TW)

(72) Inventor: Fu-Yuan Hsieh, New Taipei (TW)

(73) Assignee: Force Mos Technology Co., Ltd., New Taipei (TW)

( * ) Notice: Subject to any disclaimer, the term of this patent is extended or adjusted under 35 U.S.C. 154(b) by 27 days.

(21) Appl. No.: 13/670,499

(22) Filed: Nov. 7, 2012

(65) Prior Publication Data

US 2013/0168731 A1  Jul. 4, 2013

Related U.S. Application Data

(63) Continuation of application No. 13/341,399, filed on Dec. 30, 2011, now Pat. No. 8,614,482.

(51) Int. Cl.
*H01L 29/66* (2006.01)
*H01L 21/332* (2006.01)
*H01L 21/336* (2006.01)

(52) U.S. Cl.
USPC  257/140; 257/334; 257/E27.06; 257/E21.41; 257/E21.548; 438/140; 438/270

(58) Field of Classification Search
CPC ....... H01L 21/283; H01L 21/70; H01L 21/77; H01L 29/78; H01L 29/7811; H01L 29/66; H01L 27/06; H01L 27/0629; H01L 27/0255

USPC .................... 257/140, 334, E21.41, E21.548; 438/140, 259, 268, 270
See application file for complete search history.

(56) References Cited

U.S. PATENT DOCUMENTS

| | | | |
|---|---|---|---|
| 6,388,286 B1 * | 5/2002 | Baliga | 257/330 |
| 6,855,986 B2 * | 2/2005 | Hsieh et al. | 257/339 |
| 7,791,132 B2 * | 9/2010 | Banerjee et al. | 257/328 |
| 7,829,944 B2 * | 11/2010 | Disney | 257/331 |
| 2003/0047777 A1 * | 3/2003 | In't Zandt et al. | 257/329 |
| 2003/0127702 A1 * | 7/2003 | Blair et al. | 257/510 |
| 2005/0062124 A1 * | 3/2005 | Chiola | 257/476 |
| 2005/0112823 A1 * | 5/2005 | Cao et al. | 438/270 |
| 2007/0042552 A1 * | 2/2007 | Ma | 438/270 |
| 2008/0290367 A1 * | 11/2008 | Su et al. | 257/173 |
| 2011/0227151 A1 * | 9/2011 | Hsu et al. | 257/334 |

* cited by examiner

Primary Examiner — Nikolay Yushin
(74) Attorney, Agent, or Firm — Bacon & Thomas, PLLC

(57) ABSTRACT

A trench semiconductor power device with a termination area structure is disclosed. The termination area structure comprises a wide trench and a trenched field plate formed not only along trench sidewall but also on trench bottom of the wide trench by doing poly-silicon CMP so that the body ion implantation is blocked by the trenched field plate on the trench bottom to prevent the termination area underneath the wide trench from being implanted. Moreover, a contact mask is used to define both trenched contacts and source regions of the device for saving a source mask.

20 Claims, 17 Drawing Sheets

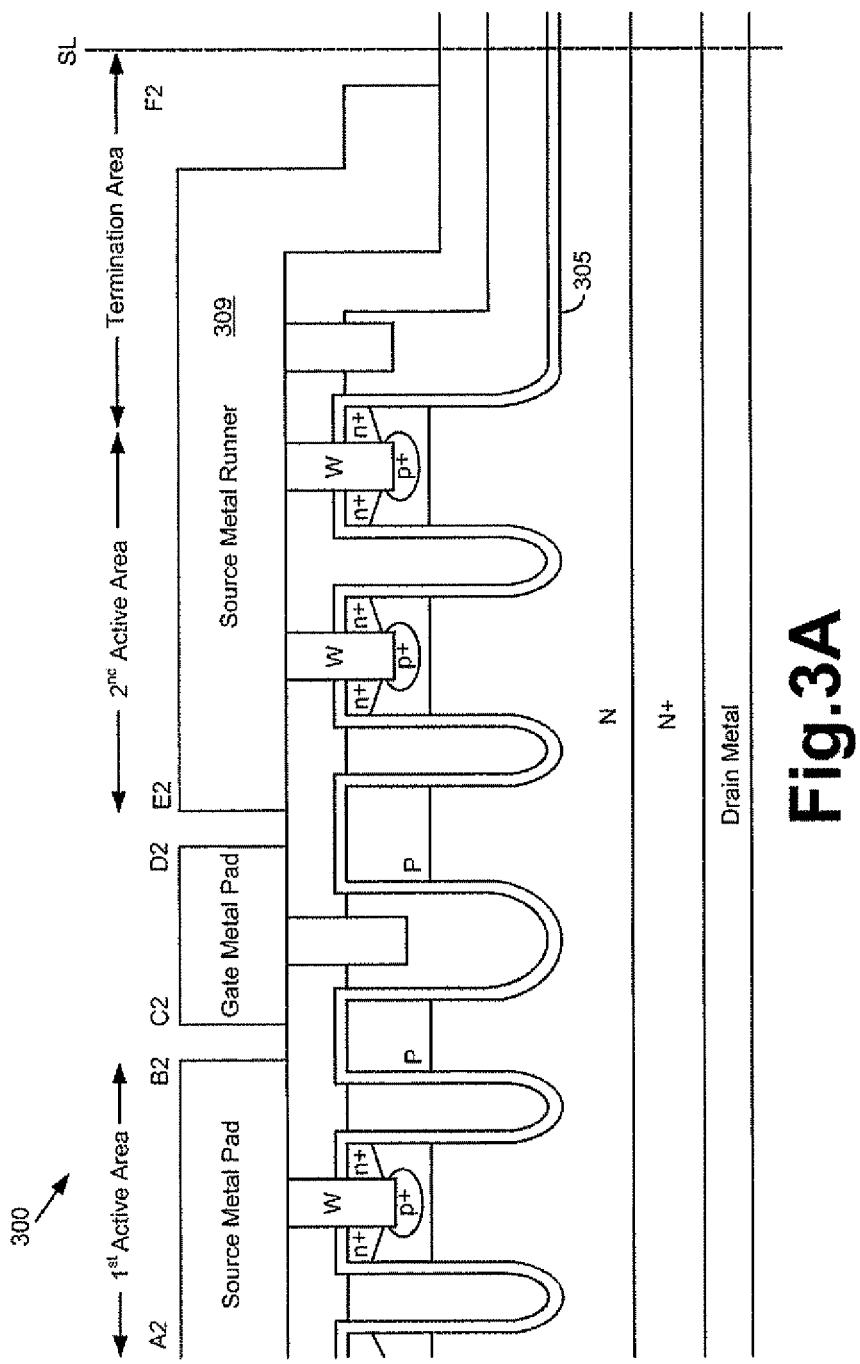

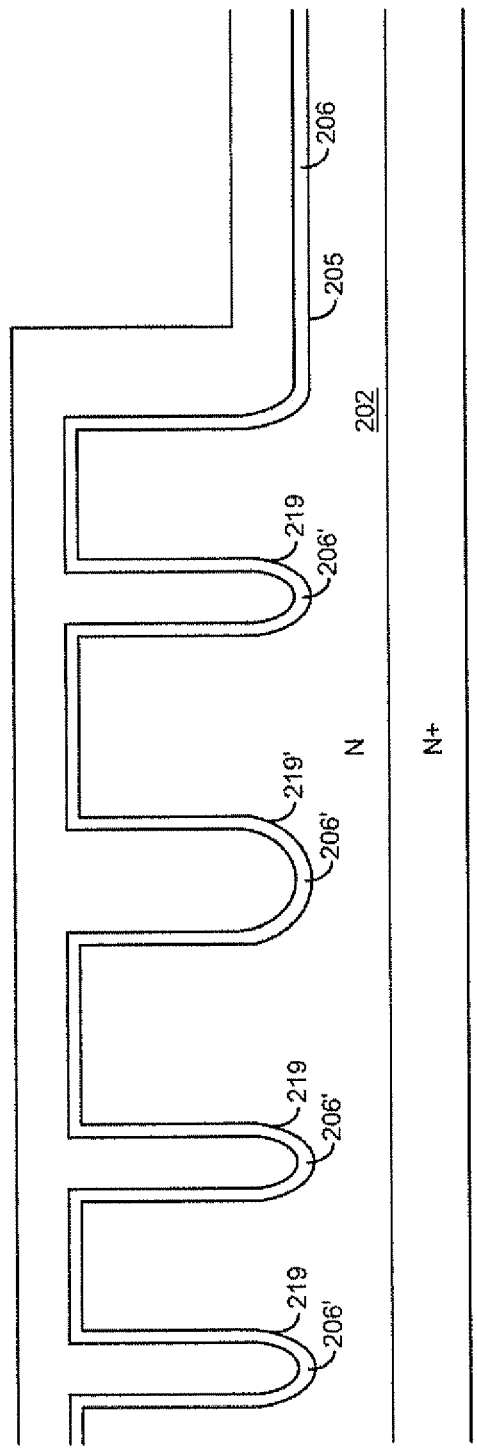

SEMICONDUCTOR POWER DEVICE HAVING WIDE TERMINATION TRENCH AND SELF-ALIGNED SOURCE REGIONS FOR MASK SAVING

CROSS-REFERENCE TO RELATED APPLICATION

This application is a Continuation-In-Part of U.S. patent application Ser. No. 13/341,399 of the same inventor, filed on Dec. 30, 2011. This application is also related to application Ser. No. 12/654,327 filed on Dec. 17, 2009 now U.S. Pat. No. 8,058,685 which has same inventor and assignee of the present application.

FIELD OF THE INVENTION

This invention relates generally to the cell structure, device configuration and fabrication process of semiconductor power devices. More particularly, this invention relates to an improved cell configuration and improved fabrication process to manufacture semiconductor power devices having improved termination area for mask saving.

BACKGROUND OF THE INVENTION

Semiconductor power devices having trenched gate structure, including trench MOSFET (metal oxide semiconductor field effect transistor), trench IGBT (insulated gate bipolar transistor) or trench Schottky rectifier, are usually used in switching-mode power supplies and in other high switching speed applications. Apart from the device configuration in an active area, a design of a termination area structure of the semiconductor power devices plays an increasingly vital role to maintain breakdown voltage of the semiconductor power devices. Meanwhile, there is still a need to reduce the manufacturing cost and to simply the manufacturing process to meet the requirement for mass production. Therefore, in view of so, U.S. Pat. Nos. 6,396,090 and 7,612,407 disclose several device configuration and manufacturing method to make semiconductor power devices with a termination area having trenched field plate which is formed into a spacer-like gate structure by doing dry poly-silicon etch.

FIG. 1A is a cross-sectional view of an N-channel trench MOSFET with a termination area 100 disclosed in the prior art of U.S. Pat. No. 6,396,090, which is formed in an N- epitaxial layer 101 extending onto a semiconductor N+ substrate 102 coated with a drain metal on a rear side. The termination area 100 further comprises: a wide trench 103 formed in the N- epitaxial layer 101; a spacer-like gate structure 104 padded by a gate oxide layer 105 and formed only along a trench sidewall of the wide trench 103; an inter-conductive oxide layer 106 covering surface of the spacer-like gate structure 104; a termination oxide layer 107 formed in the wide trench 103 to define a contact area for a source metal to contact with an active area. On the other hand, according to the prior art, a body mask is saved because that the semiconductor silicon layer for the P body region 108 is epitaxially formed without requiring a body mask.

The termination area structure comprising the wide trench and the spacer-like gate structure aforementioned do have the capability of preventing voltage breakdown phenomena from premature without requiring an extra cost which is superior to other conventional termination area structures known to those having skill in the art. However, when making a trench MOSFET with a termination area using the aforementioned configuration and method as shown in FIG. 1A, a pronounced problem comes out that the P type semiconductor silicon layer for the P body region 108 is formed epitaxially before etching a plurality of trenches 109 in the active area to save a body mask as discussed above, causing Boron segregation along trench sidewalls of the trenches 109 in the active area during a growth step for a sacrificial oxide (not shown) and for the gate oxide layer 105 and leading to undesirable punch-through vulnerabilities. The punch-through issue becomes more pronounced when cell pitch of the semiconductor power device is decreased less than 2.0 um.

In order to overcome the punch-through issue, another semiconductor power device with a termination area structure 130 is disclosed in U.S. Pat. No. 7,612,407 wherein the body region is formed by an ion implantation step after forming a plurality of trenches, as shown in FIG. 1B. The termination area structure 130 comprises an oxide layer 131 formed in middle of a spacer-like gate structure 132 in a wide trench 133 before the ion implantation process for formation of the P body region 134. Therefore, the P body region 134 will not be disposed below trench bottom of the wide trench 133 because the oxide layer 131 is acting as a body ion implantation blocking layer, sustaining a high breakdown voltage in the termination area structure 130. However, there is an extra cost for depositing and CMP (Chemical Mechanical Polishing) the oxide layer 131, which is not conductive to mass production.

Therefore, there is still a need in the art of the semiconductor power device design and fabrication, particular in the termination area, to provide a novel cell structure, device configuration and fabrication process that would further resolve the problems discussed above.

SUMMARY OF THE INVENTION

It is therefore an aspect of the present invention to provide a semiconductor power device with an improved termination area structure so that the two goals of sustaining a high breakdown voltage and reducing the manufacturing cost can be satisfied simultaneously. The trench semiconductor power device can be trench MOSFET, trench IGBT, or integrated circuit selected therefrom. According to the present invention, there is provided a semiconductor power device having a termination area, further comprising: an epitaxial layer of a first conductivity type supported onto a substrate; a wide termination trench formed in the epitaxial layer in the termination area; a trenched field plate disposed along inner surface of the wide termination trench and padded with a termination insulating layer, having a L shape or an U shape structure and connected to a source metal runner; a first active area under a source metal pad which is shorted to the source metal runner, having a plurality of transistor cells and source regions of the first conductivity type; a second active area near the wide termination trench under the source metal runner, having the source regions and at least one stripe transistor cell; wherein the source regions are not only vertically but also laterally diffused in an upper portion of body regions of a second conductivity type as disclosed in U.S. Pat. No. 8,058,685, each of the source regions having a greater junction depth and a higher doping concentration along sidewalls of a trenched source-body contact to an adjacent channel region near trenched gates flanked by the source regions in a same distance from a top surface of the epitaxial layer, wherein the trenched source-body contact is filled with a contact metal plug and penetrating through a contact interlayer, the source regions and extending into the body regions to connect the source regions and the body regions in the first and second active areas respectively to the source metal pad and to the source metal runner. That is, in the termination area structure, the trenched field plate is formed not only along trench sidewall of the wide termination trench but also on trench bottom of the wide termination trench by doping poly CMP instead of dry poly etch used by the aforementioned prior art so that the portion of the trenched field plate on the trench bottom of the wide termination trench can be a block layer to prevent the semiconductor silicon layer underneath the wide termination trench in the termination area from being implanted by a body ion implantation which is performed for body formation, which also means that the body regions are formed by the body ion implantation instead of epitaxial growth used in the prior art, therefore, an improved termination area structure for semiconductor power devices is realized having the capability of sustaining a high breakdown voltage and reducing the manufacturing cost because no body mask or extra block layer is needed. Moreover, both the source regions and the source-body contacts are defined by a contact mask as disclosed in U.S. Pat. No. 7,816,720 which of the same inventor and assignee as this invention, therefore, a source mask is saved for further manufacturing cost reduction.

According to the present invention, the semiconductor power device further comprises a connection trenched gate penetrating through the body regions and extending into the epitaxial layer under a gate metal pad for gate connection, wherein the body regions surrounding the connection trenched gate have floating voltage. Meanwhile, the connection trenched gate has a less trench width than the wide termination trench but has a greater trench width than the trenched gates in the first and second active areas. Furthermore, the connection trenched gate is formed simultaneously as the trenched gates, therefore has a same gate structure as the trenched gates.

According to the present invention, in some preferred embodiments, the first active area comprises a plurality of closed transistor cells and the second active area comprises one stripe transistor cell. In some other preferred embodiments, the first active area comprises a plurality of closed transistor cells, and the second active area comprises one stripe transistor cell and a plurality of closed transistor cells. In some other preferred embodiments, the first active area comprises a plurality of stripe transistor cells and the second active area comprises a plurality of stripe transistor cells.

According to the present invention, in the termination area of some preferred embodiments, the wide termination trench which is extending from the boundary of the semiconductor power device can be further extending to a device edge which is illustrated as a scribe line for example in FIG. 2A. In the termination area of some other preferred embodiments, the wide termination trench which is extending from the boundary of the semiconductor power devices is not extending to the device edge for example in FIG. 6, that is to say, the wide trench has a trench bottom ended within the device edge.

According to the present invention, in some preferred embodiments, the trenched gates in the first and second active areas each comprises a single electrode padded by a gate oxide layer and formed in an active trench, for example in FIG. 6, wherein the gate oxide layer has a thickness along bottom equal to or thinner than along sidewalls of the single electrode. In some other preferred embodiments, the trenched gates in the first and second active areas each comprises a single electrode padded by a gate oxide layer and formed in an active trench, for example in FIG. 7, wherein the gate oxide layer has a greater thickness along bottom than along sidewalls of the single electrode. In some other preferred embodiments, the trenched gates in the first and second active areas can be implemented by each comprising a shielded electrode in a lower portion and a gate electrode in an upper portion, for example in FIG. 8, wherein the shielded electrode is insulated from the epitaxial layer by a shielded insulating layer, the gate electrode is insulated from the source regions and the body regions by a gate oxide layer, the shielded electrode and the gate electrode are insulated from each other by an inter-poly insulating layer formed therebetween, wherein the shielded insulating layer has a greater thickness than the gate oxide layer.

According to the present invention, in some preferred embodiments, especially in the case of a trench MOSFET, the trenched field plate is connected to the source metal runner via a trenched field plate contact which is filled with the contact metal plug, penetrating through the contact interlayer and extending into the trenched field plate, the connection trenched gate is connected to the gate metal pad via a trenched gate contact which is filled with the contact metal plug, penetrating through the contact interlayer and extending into filling-in material of the connection trenched gate for gate connection. Wherein, the contact metal plug can be implemented by using a tungsten metal layer padded by a barrier layer of Ti/TiN or Co/TiN.

According to the present invention, in some preferred embodiment, the trenched gates in the first and second active areas, the connection trenched gate and the wide termination trench each has a trench bottom surrounded by an on-resistance reduction region, as shown in FIG. 5. In the case of an N-channel trench MOSFET, the on-resistance reduction region can be an n* region which has a same conductive doping type and a greater doping concentration compared with an N epitaxial layer which is extending over an N+ substrate.

According to the present invention, in some preferred embodiment, the semiconductor power device can be formed as a trench MOSFET formed in an epitaxial layer of a first conductivity type onto a substrate of the first conductivity type. In some other preferred embodiment, the semiconductor power device can be formed as a trench IGBT (Insulated Gate Bipolar Transistor) formed in an epitaxial layer of a first conductivity type onto a buffer layer of the first conductivity type, which has a higher doping concentration than the epitaxial layer, extending over a substrate of a second conductivity type.

It is therefore another aspect of the present invention to provide a method of manufacturing a trench semiconductor power device with a wide trenched termination area using three mask process, comprising: forming a wide termination trench in a termination area, a plurality of active trenches in first and second active areas and at least a gate connection trench in an epitaxial layer; forming an oxide layer on top surface of the epitaxial layer, inner surface of the wide termination trench, the active trenches and the gate connection trench; depositing a doped poly-silicon layer; carrying out CMP (Chemical Mechanical Polishing) to remove the doped poly-silicon layer from the top surface of the epitaxial layer, leaving the doped poly-silicon layer on inner surface of the wide termination trench including trench sidewalls and trench bottom as a trenched field plate having a L shape or U shape structure, and leaving necessary portion of the doped poly-silicon layer in the active trenches and the gate connection trench to form trenched gates in the first and second active areas and to form a connection trenched gate; carrying out body ion implantation to form body regions without requiring a body mask; depositing a contact interlayer onto entire top surface; applying a contact mask onto the contact interlayer and etching a plurality of contact holes to expose a top surface of the body regions and a top surface of the doped poly-silicon in the connection trenched gate; carrying out source ion implantation without requiring a source mask; performing source diffusion to form source regions self-aligned to the contact holes in the first and second active areas.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein:

FIG. 3A is a cross-sectional view of another preferred embodiment according to the present invention.

FIGS. 9A to 9F are a serial of side cross sectional views for showing the processing steps for fabricating a semiconductor power device with an improved termination area structure as shown in FIG. 2A.

DETAILED DESCRIPTION OF THE EMBODIMENTS

In the following Detailed Description, reference is made to the accompanying drawings, which forms a part thereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be make without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1A:
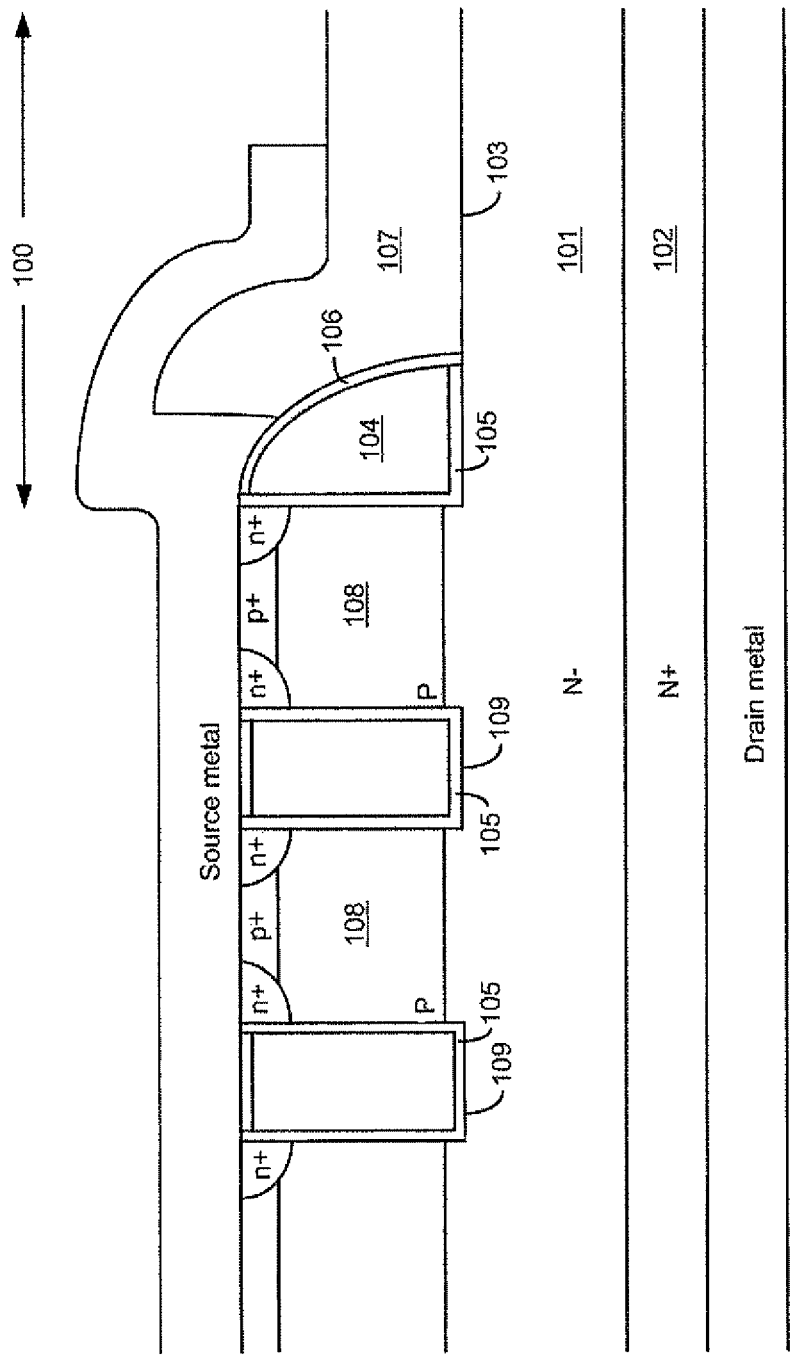
FIG. 1A is a cross-sectional view of a MOS device with a termination area disclosed in prior art.
Figure 1B:
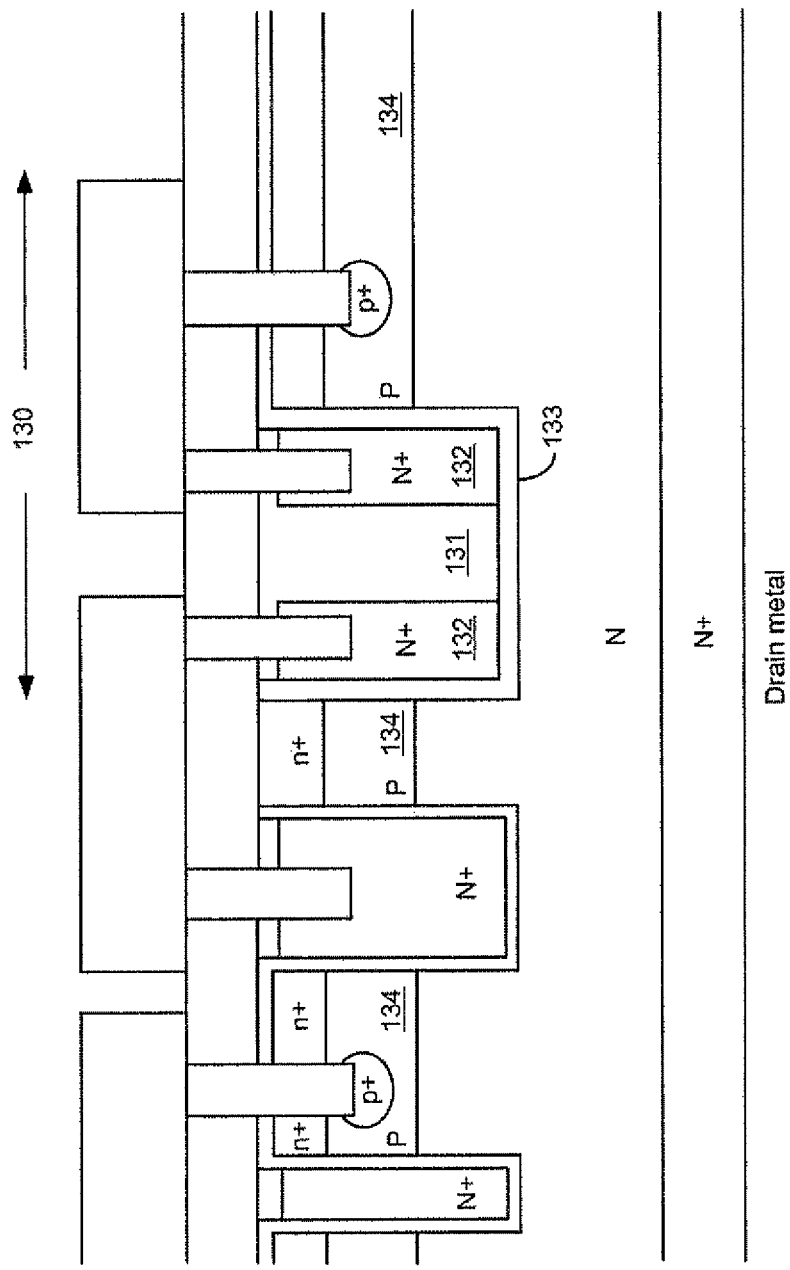
FIG. 1B is a cross-sectional view of a trench MOSFET with a termination area disclosed in prior art.
Figure 2A:
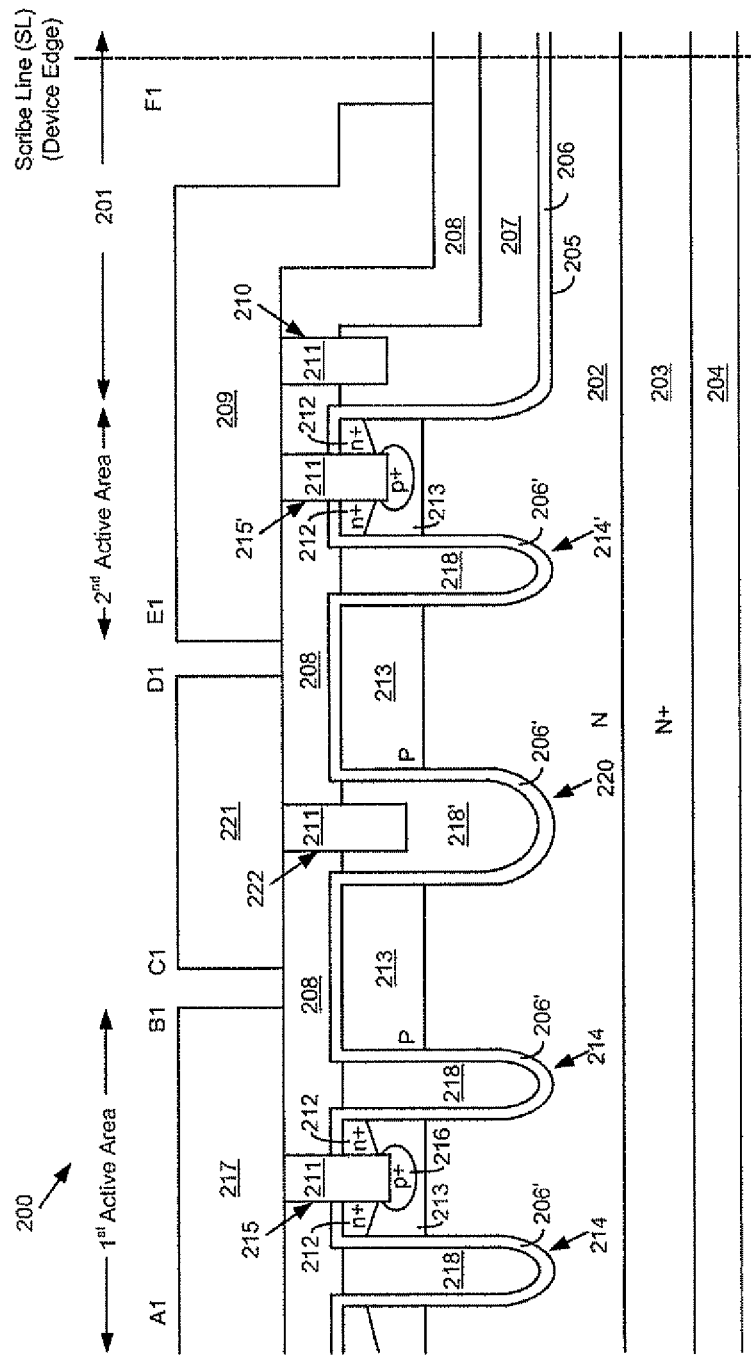
FIG. 2A is a cross-sectional view of a preferred embodiment according to the present invention.
Figure 2B:
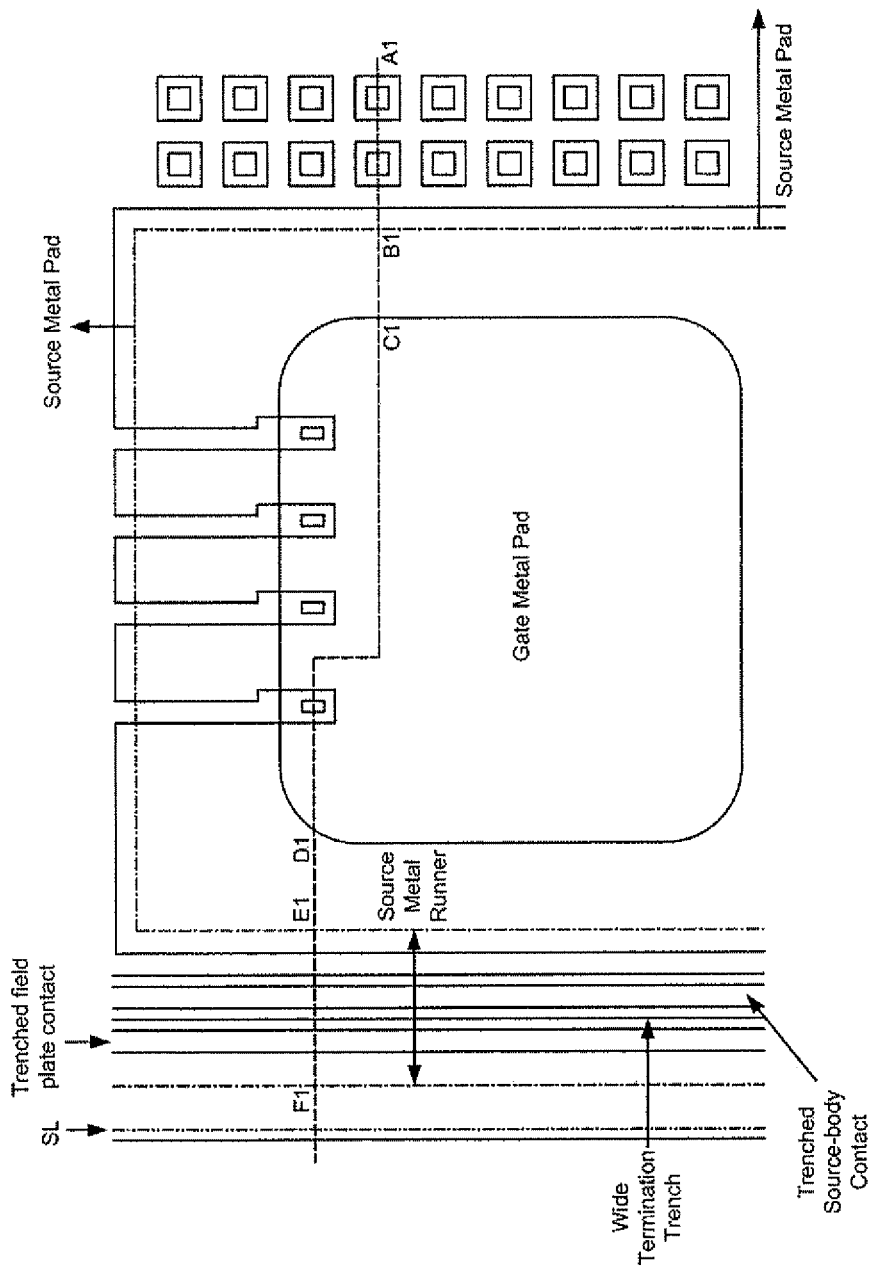
FIG. 2B is a top view of the preferred embodiment of FIG. 2A according to the present invention.

Please refer to FIG. 2A for a preferred embodiment of this invention which is also the A1-B1-C1-D1-E1-F1 cross section of FIG. 2B. FIG. 2A shows an N-channel trench MOSFET 200 with an improved termination area structure 201 formed in an N epitaxial layer 202 extending over a heavily doped N+ substrate 203 coated with a back metal of Ti/Ni/Ag on the rear side as a drain metal 204 to serve as a bottom electrode for drain contact. In the case of forming an N-channel IGBT, the semiconductor power device can be formed in an N epitaxial layer onto an N+ buffer layer which is extending over a P+ substrate. The termination area 201 further comprises: a wide termination trench 205 extending from a boundary of the N-channel trench MOSFET across a device edge (illustrated as a scribe line); a termination insulating layer 206 along trench sidewall and trench bottom of the wide termination trench 205; a trenched field plate 207 formed onto the termination insulating layer 206, covering the trench sidewall and the trench bottom of the wide termination trench 205 and having a L shape structure; a contact interlayer 208 covering outer surface of the trenched field plate 207. The trenched field plate 207 is connected to a source metal runner 209 through a trenched field plate contact 210 which is filled with a contact metal plug 211 while penetrating through the contact interlayer 208 and extending into the trenched field plate 207. From FIG. 2B it can be seen that, the N-channel trench MOSFET 200 has two kind of active areas, which is a first active area (1$^{st}$ active area as illustrated in FIG. 2A) under a source metal pad and comprising a plurality of closed transistor cells, wherein the source metal pad is shorted to the source metal runner to serve as a top electrode for source contact, and a second active area (2$^{nd}$ active area as illustrated in FIG. 2A) under the source metal runner near the wide termination area 205 and comprising a stripe transistor cell. According to the present invention, the first active area further comprises: a plurality of trenched gates 214 surrounded by n+ source regions 212 encompassed in P body regions 213; a trenched source-body contact 215 in each of the closed transistor cells, filled with the contact metal plug 211 while penetrating through the contact interlayer 208, the n+ source regions 212 and extending into the P body regions 213; a p+ body ohmic doped region 216 underneath the n+ source regions 212 and surrounding at least bottom of the trenched source-body contact 215 to reduce the contact resistance between the contact metal plug 211 and the P body regions 213. Wherein the n+ source regions 212 are defined by a contact mask and formed by source diffusion, therefore each has a greater junction depth and a higher doping concentration along sidewalls of the trenched source-body contact 215 than along an adjacent channel region near the trenched gates 214 in a same distance from a top surface of the N epitaxial layer 202. The second active area further comprises a similar structure to the first active area wherein the trenched source-body contact 215' filled with the contact metal plug 211 formed in the stripe transistor cell is located between the trenched gate 214' and the wide termination trench 205, connecting the n+ source regions 212 and the P body regions 213 to the source metal runner 209. The N-channel trench MOSFET 200 further comprises at least a connection trenched gate 220 for gate connection, wherein the connection trenched gate 220 is shorted to a gate metal pad 221 through a trenched gate contact 222 which is filled with the contact metal plug 211 while penetrating through the contact interlayer 208 and extending into the filling-in material of the connection trenched gate 220, wherein the gate metal pad 221 is separated from the source metal runner 209 and the source metal pad 217 to serve as another top electrode for gate contact. What should be noticed is that, the P body regions 213 surrounding the connection trenched gate 220 have floating voltage, and, the connection trenched gate 220 has a greater trench width than the trenched gates 214 and 214' in the first and second active areas, while has a less trench width than the wide termination trench 205 in the termination area 201. In this preferred embodiment, the trenched gates 214 and 214' each comprises a single gate electrode 218 padded by a gate oxide layer 206' (the same oxide layer as the termination insulating layer 206 in the termination area 201) which has a thickness along sidewalls equal to or greater than along bottom of each the single gate electrode 218, and the connection trenched gate 220 comprises a wide single gate electrode 218' padded by the gate oxide layer 206'. Furthermore, the contact metal plug 211 can be implemented by using a tungsten plug padded by a barrier layer of Ti/TiN or Co/TiN.

Figure 3B:
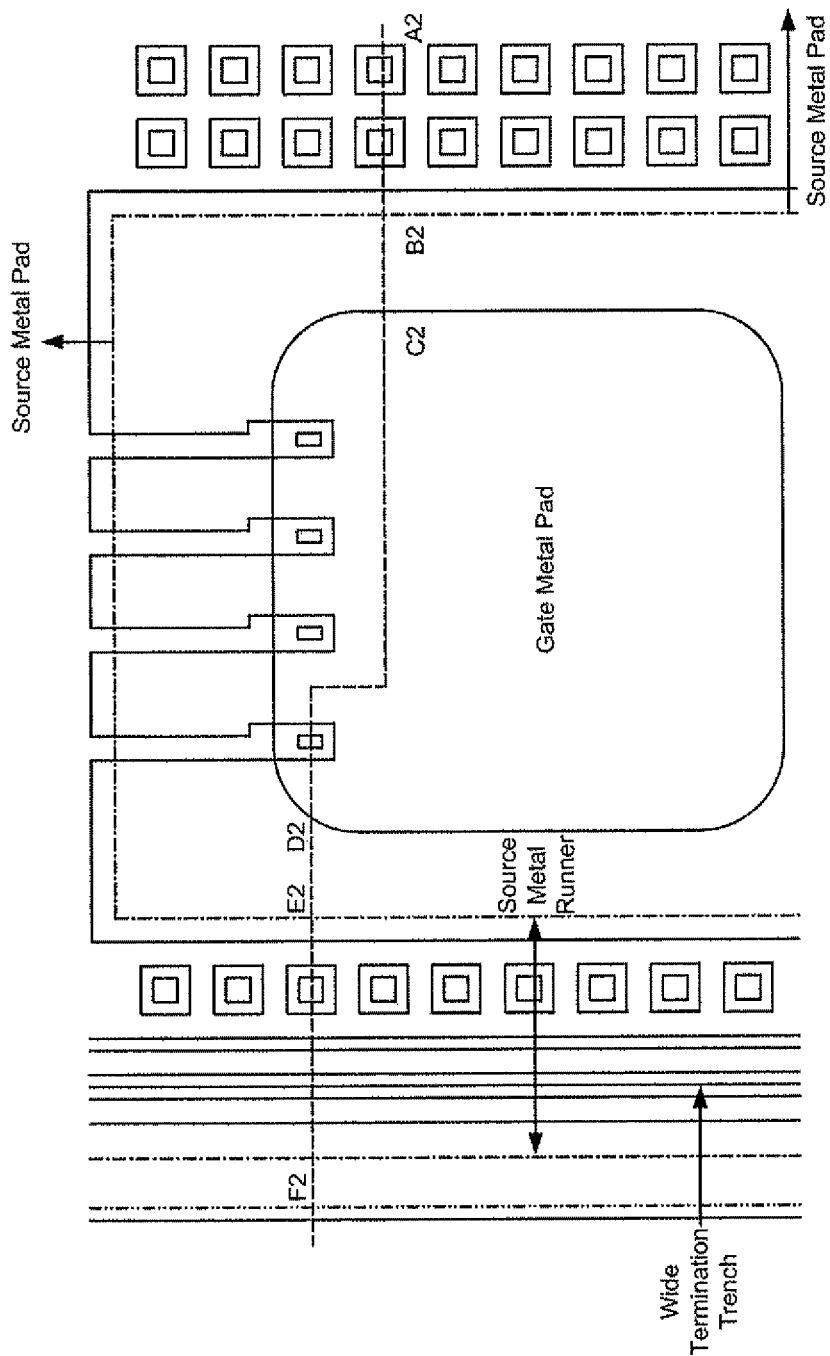
FIG. 3B is a top view of the preferred embodiment of FIG. 3A according to the present invention.

FIG. 3A is a cross-sectional view of another trench MOSFET 300 with an improved termination area according to the present invention, corresponding to the A2-B2-C2-D2-E2-F2 cross-sectional of the top view as shown in FIG. 3B. From FIG. 3B it can be seen that, the difference between the trench MOSFET 300 of FIG. 3B and the trench MOSFET 200 of FIG. 2B is that, in FIG. 3B, the second active area comprises one stripe transistor cells and a plurality of closed transistor cells. Therefore, in FIG. 3A, there are more transistor cells under the source metal runner 309 near the wide termination trench 305 than FIG. 2A.

Figure 4:
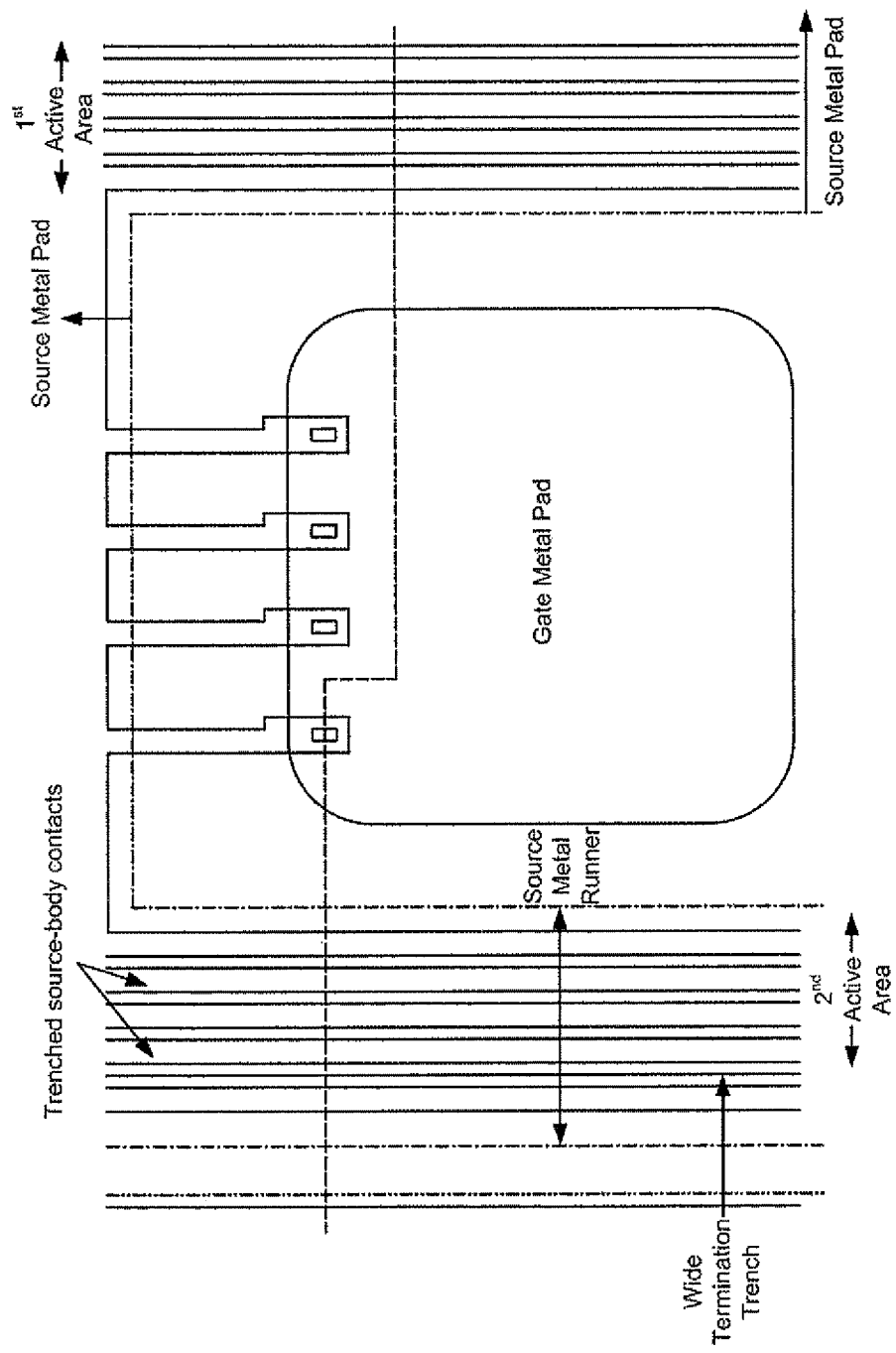
FIG. 4 is a top view of another preferred embodiment according to the present invention.

FIG. 4 is a top view of another trench MOSFET with an improved termination area according to the present invention which has a similar configuration to FIG. 2B except that, in FIG. 4, the first active area comprises a plurality of stripe transistor cells and the second active area comprises a plurality of stripe transistor cells.

Figure 5:
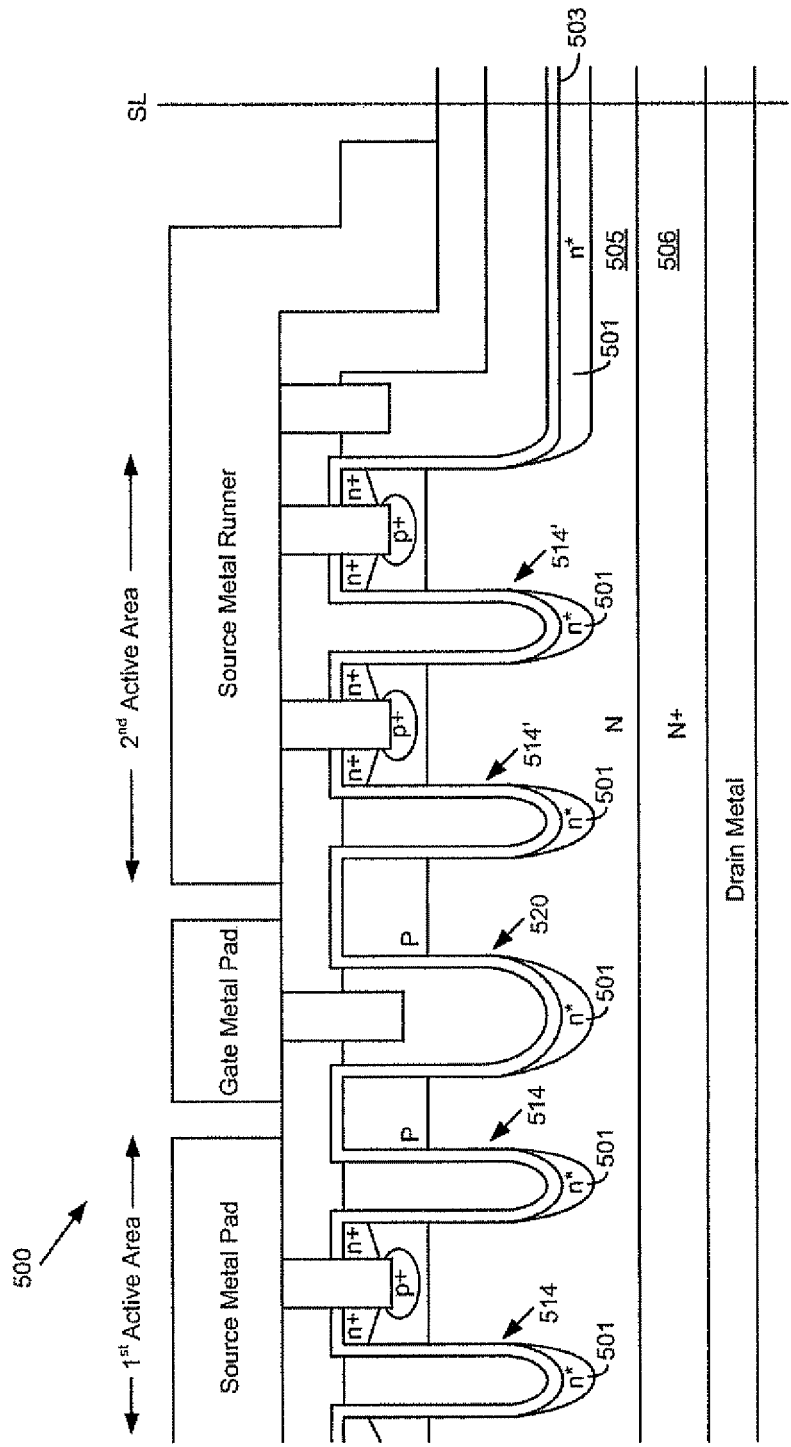
FIG. 5 is a cross-sectional view of another preferred embodiment according to the present invention.

FIG. 5 is a cross-sectional view of another N-channel trench MOSFET 500 with an improved termination area according to the present invention which is similar to the N-channel trench MOSFET 300 of FIG. 3A except that, in FIG. 5, the N-channel trench MOSFET 500 further comprises an n* on-resistance reduction region (or a p* on-resistance reduction region in a P-channel semiconductor power device) 501 surrounding each trench bottom of: the connection trenched gate 520, the wide termination trench 503 and each of the trenched gates 514 and 514' in the first and second active areas, to mainly reduce on-resistance of the N-channel trench MOSFET 500, wherein the n* on-resistance reduction region 501 has a doping concentration higher than the N epitaxial layer 505 but lower than the N+ substrate 506.

Figure 6:
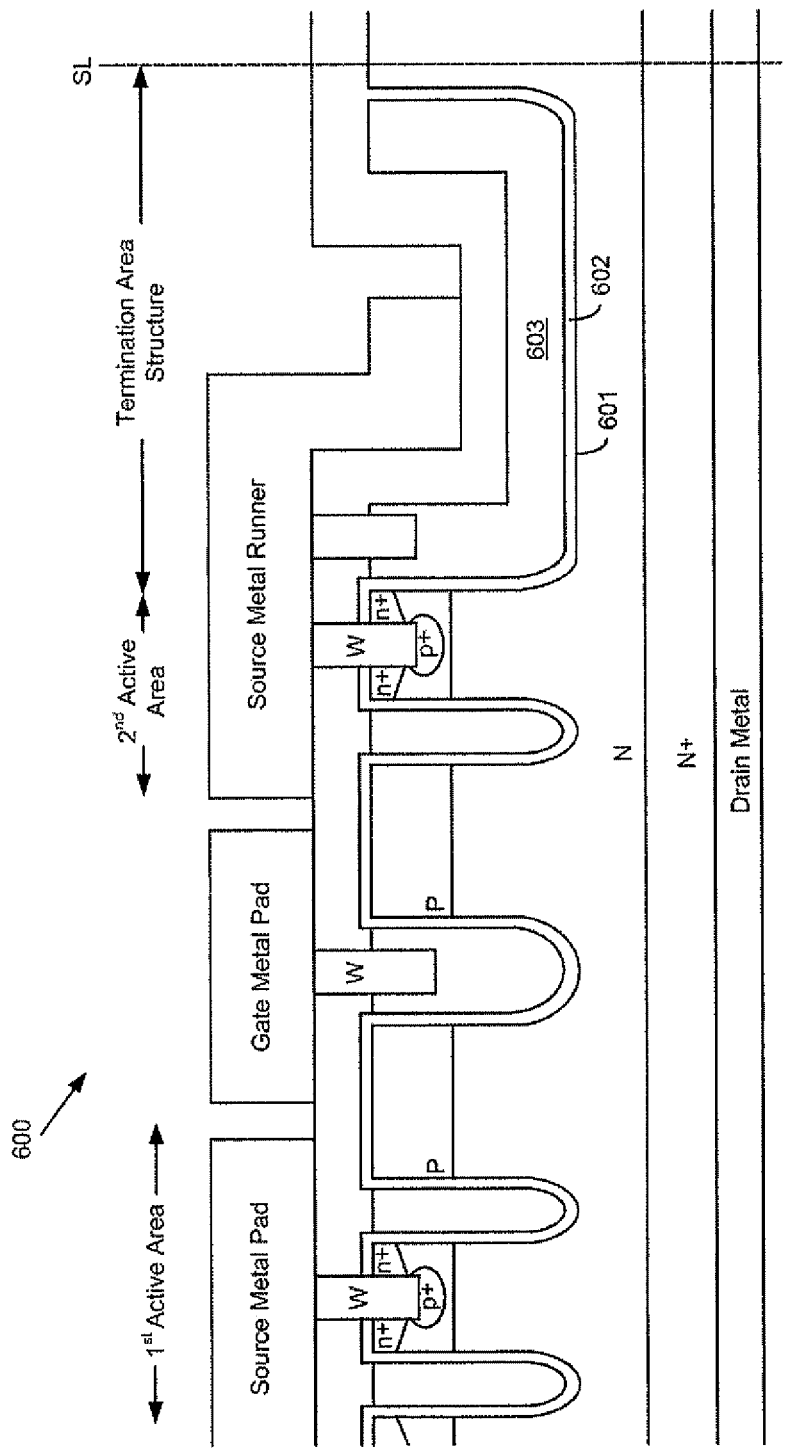
FIG. 6 is a cross-sectional view of another preferred embodiment according to the present invention.

FIG. 6 is a cross-sectional view of another N-channel trench MOSFET 600 with an improved termination area according to the present invention which is similar to the N-channel trench MOSFET 200 of FIG. 2A except that, in FIG. 6, the wide termination trench 601 extending from a boundary of the N-channel trench MOSFET 600 is not extending to a device edge according to this preferred embodiment, which is to say, the wide termination trench 601 has a trench bottom ended within the device edge (illustrated as SL). Accordingly, the termination area further comprises a termination insulating layer 602 and a trenched fielded plate 603 thereon covering the whole trench sidewalls and the whole trench bottom of the wide termination trench 601.

Figure 7:
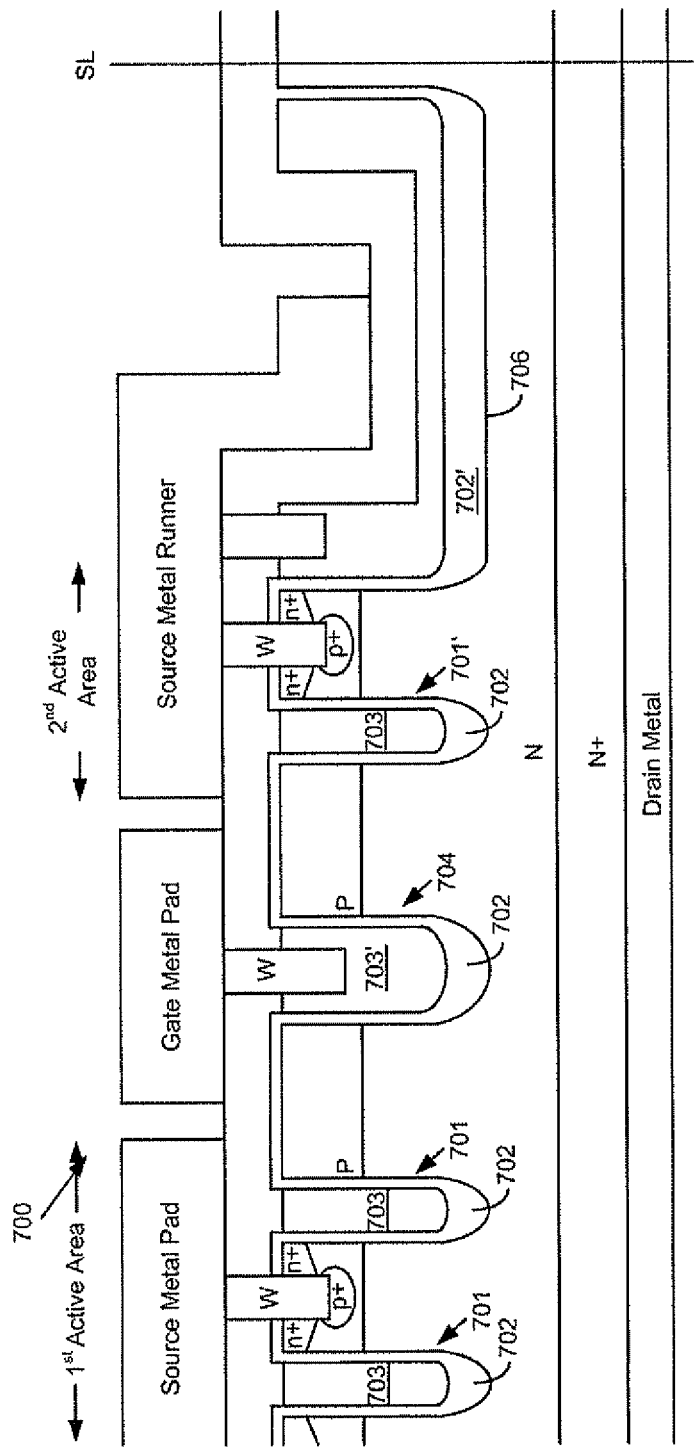
FIG. 7 is a cross-sectional view of another preferred embodiment according to the present invention.

FIG. 7 is a cross-sectional view of another N-channel trench MOSFET 700 with an improved termination area according to the present invention which is similar to the N-channel trench MOSFET 600 of FIG. 6 except that, in FIG. 7, the gate oxide layer 702 along trench bottom of each of the trenched gates 701 and 701' in the first and second active area, and along trench bottom of the connection trenched gate 704 has a greater thickness than along the sidewalls of all those trenched gates to reduce Qgd. Meanwhile, the termination insulating layer 702' has a greater thickness along trench bottom of the wide termination trench 706 than along sidewalls of the wide termination trench 706 according to this preferred embodiment.

Figure 8:
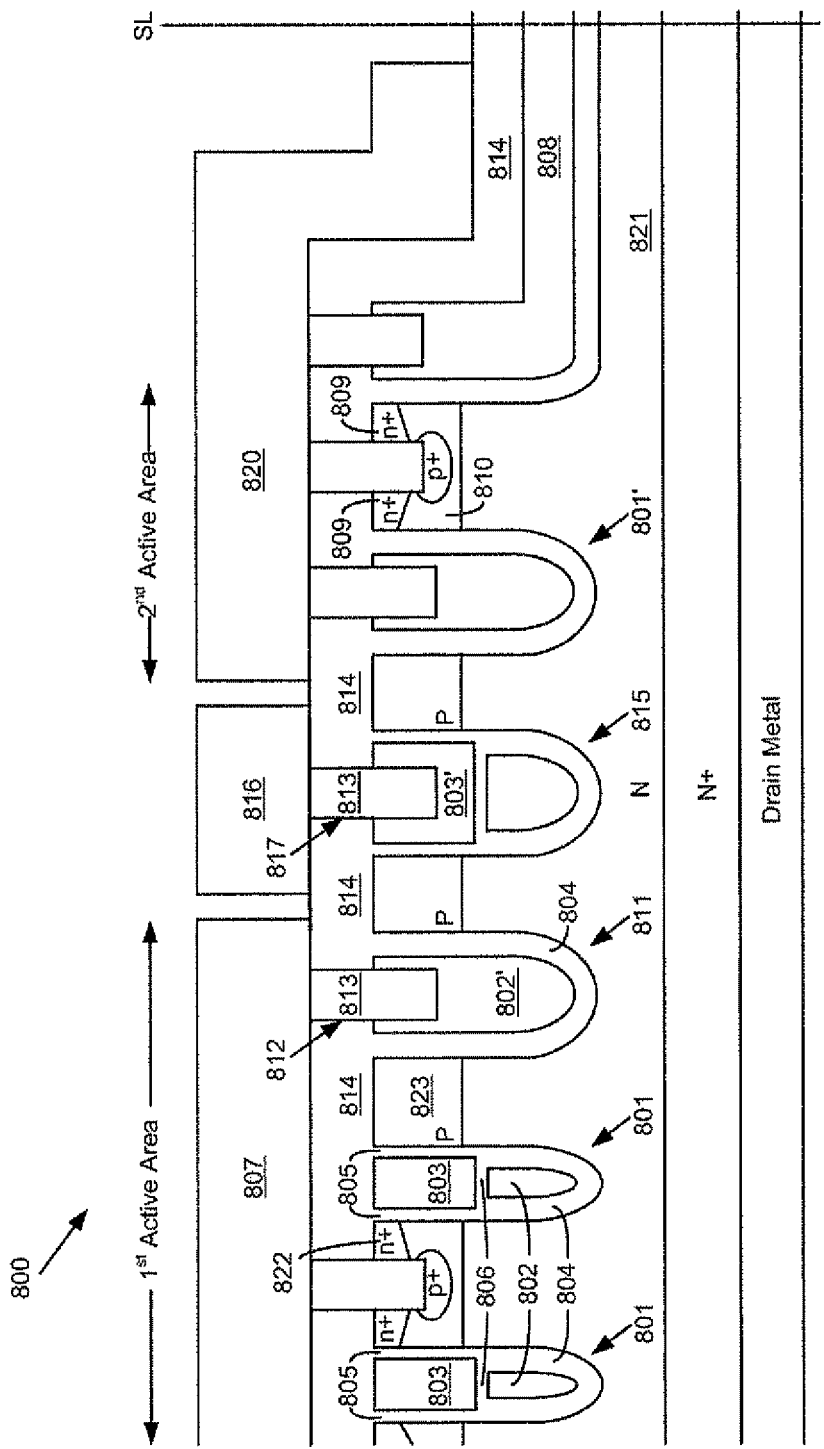
FIG. 8 is a cross-sectional view of another preferred embodiment according to the present invention.

FIG. 8 shows another N-channel trench MOSFET 800 with an improved termination area according to the present invention which is similar to the N-channel trench MOSFET 200 in FIG. 2A except that, the trenched gates 801 in the first active area each comprises a shielded electrode 802 in a lower portion and a gate electrode 803 in an upper portion, wherein the shielded electrode 802 is insulated from the N epitaxial layer 821 by a shielded insulating layer 804, the gate electrode 803 is insulated from the n+ source regions 822 and the P body regions 823 by a gate oxide layer 805, and the shielded electrode 802 is insulated from gate electrode 803 by an inter-poly insulating layer 806, wherein the shielded insulating layer 804 has a greater thickness than the gate oxide layer 805. Meanwhile, each the shielded electrode 802 is shorted to the source metal pad 807 through a shielded electrode trenched gate 811, comprising a single shielded electrode 802' formed simultaneously with the shielded electrode 802 and padded by the shielded insulating layer 804, wherein the single shielded electrode 802' is shorted to the source metal pad 807 through a trenched shielded electrode contact 812 which is filled with a contact metal plug 813 while penetrating through the contact interlayer 814 and extending into the single shielded electrode 802'. At the same time, the N-channel trench MOSFET 800 further comprises a connection trenched gate 815 having a same shielded gate structure as the trenched gates 801 in the first active area, in which a wide gate electrode 803' in an upper portion of the connection trenched gate 815 is shorted to the gate metal pad 816 through a trenched gate contact 817 which is filled with the contact metal plug 813 while penetrating through the contact interlayer 814 and extending into the wide gate electrode 803'.

Figure 9A:
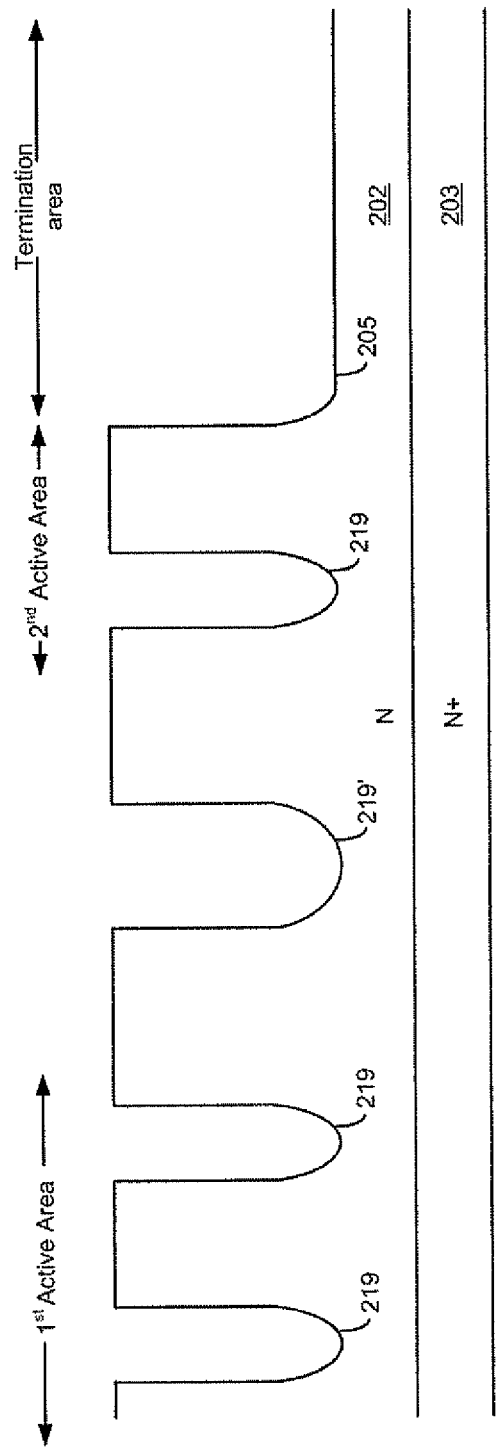

FIGS. 9A to 9F show a process of manufacturing the N-channel trench MOSFET with an improved termination area structure as shown in FIG. 2A. Referring to FIG. 9A, an N epitaxial layer 202 is initially grown on a heavily doped N+ substrate 203. Next, a trench mask (not shown) is applied and followed by a trench etching process to define three kinds of trenches in the N epitaxial layer 202, including: a wide termination trench 205 in a termination area; a plurality of active trenches 219 in first and second active areas; and a gate connection trench 219' for gate connection, wherein the gate connection trench 219' has a less trench width than the wide termination trench 205 but has a greater trench width than the active trenches 219. Then, a sacrificial oxide layer (not shown) is grown and etched to remove the plasma damaged silicon layer formed during the process of opening all kinds of the trenches.

Figure 9C:
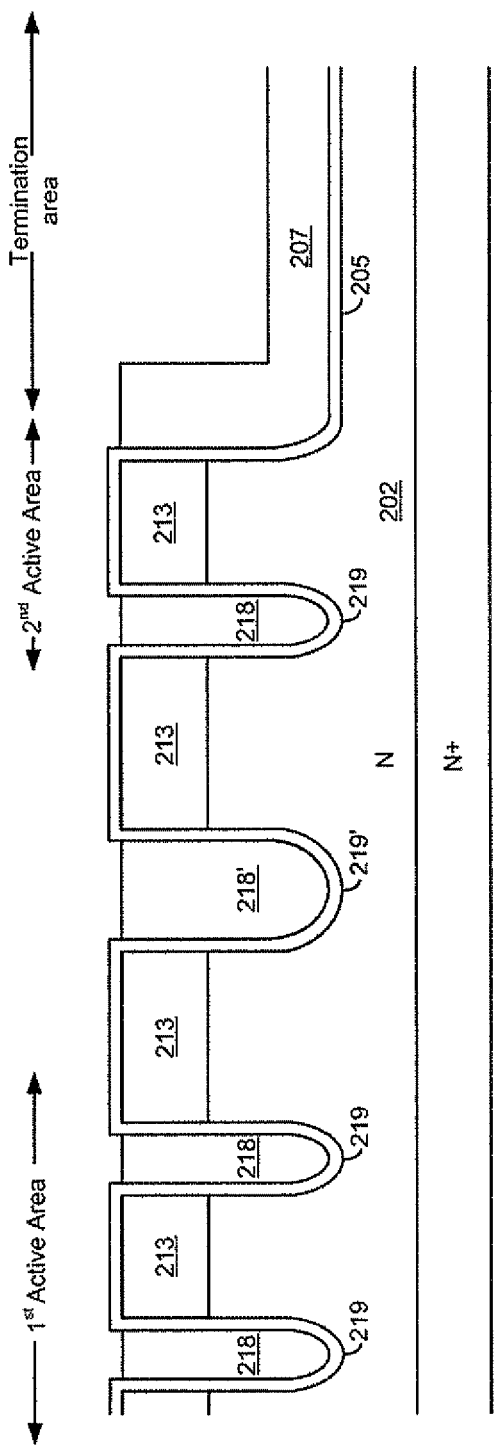

In FIG. 9B, an oxide layer is deposited covering a top surface of the N epitaxial layer 202 and along inner surface of all kinds of the trenches to respectively act as a termination insulating layer 206 in the wide termination trench 205 and a gate oxide layer 206' in each of the active trenches 219 and the gate connection trench 219'. Then, a doped poly-silicon layer is formed onto the oxide layer, as shown in FIG. 9B, and followed by a poly-silicon CMP process to leave the necessary portion of the poly-silicon layer within each of the trenches, as shown in FIG. 9C, to respectively form: a trenched field plate 207 covering trench bottom and trench sidewall of the wide termination trench 205; a single electrode 218 in each of the active trenches 219; and a wide single electrode 218' in the gate connection trench 219'. Then, a plurality of P body regions 213 are formed in an upper portion of the N epitaxial layer 202 by a body ion implantation process which is performed without requiring a body mask because the trenched field plate 207 on the trench bottom of the wide termination trench 205 prevents the termination area underneath the wide termination trench 205 from being implanted.

Figure 9D:
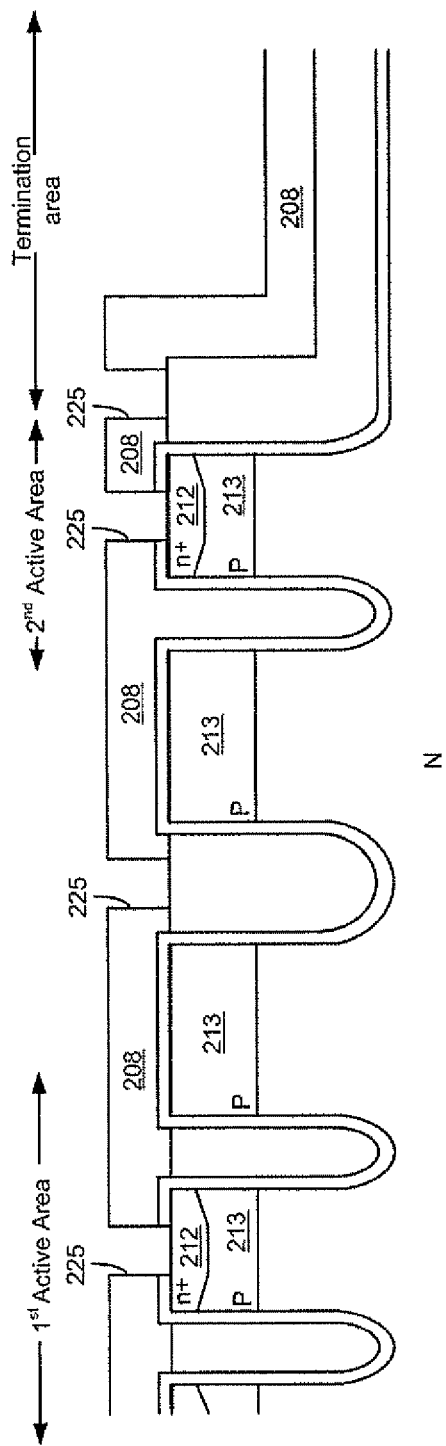

In FIG. 9D, a thick oxide layer is deposited on the entire surface of the structure in FIG. 9C as a contact interlayer 208. Then, a contact mask (not shown) is employed and then followed by a dry oxide etch process to define a plurality of contact holes 225. Next, a source ion implantation process is carried out through the contact holes 225 and then followed by a source lateral diffusion process to form a plurality of n+ source regions 212 near a top surface of the P body region 213 in the first and second active areas of the trench MOSFET without requiring a source mask.

Figure 9E:
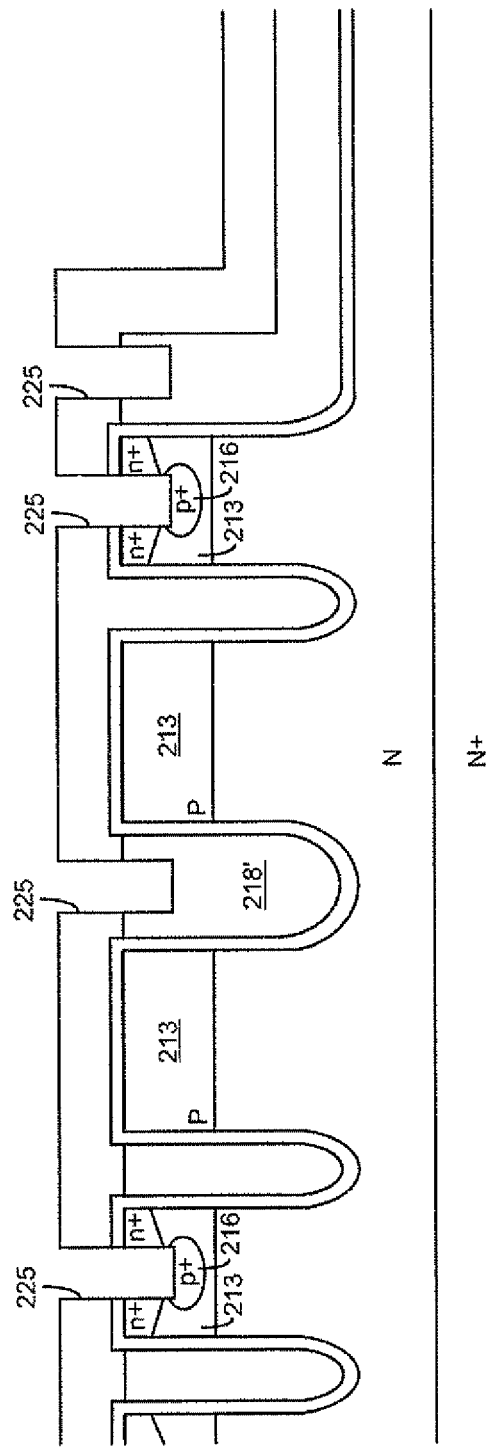

In FIG. 9E, a dry silicon etch process is carried out to make the contact holes 225 respectively further extend into the P body regions 213 and the wide single electrode 218'. Next, after carrying out a BF2 ion implantation and a step of RTA (rapid thermal annealing), a p+ body ohmic doped region 216 is formed surrounding bottom of each of the contact holes 225 in the portion of the P body region 213.

Figure 9F:
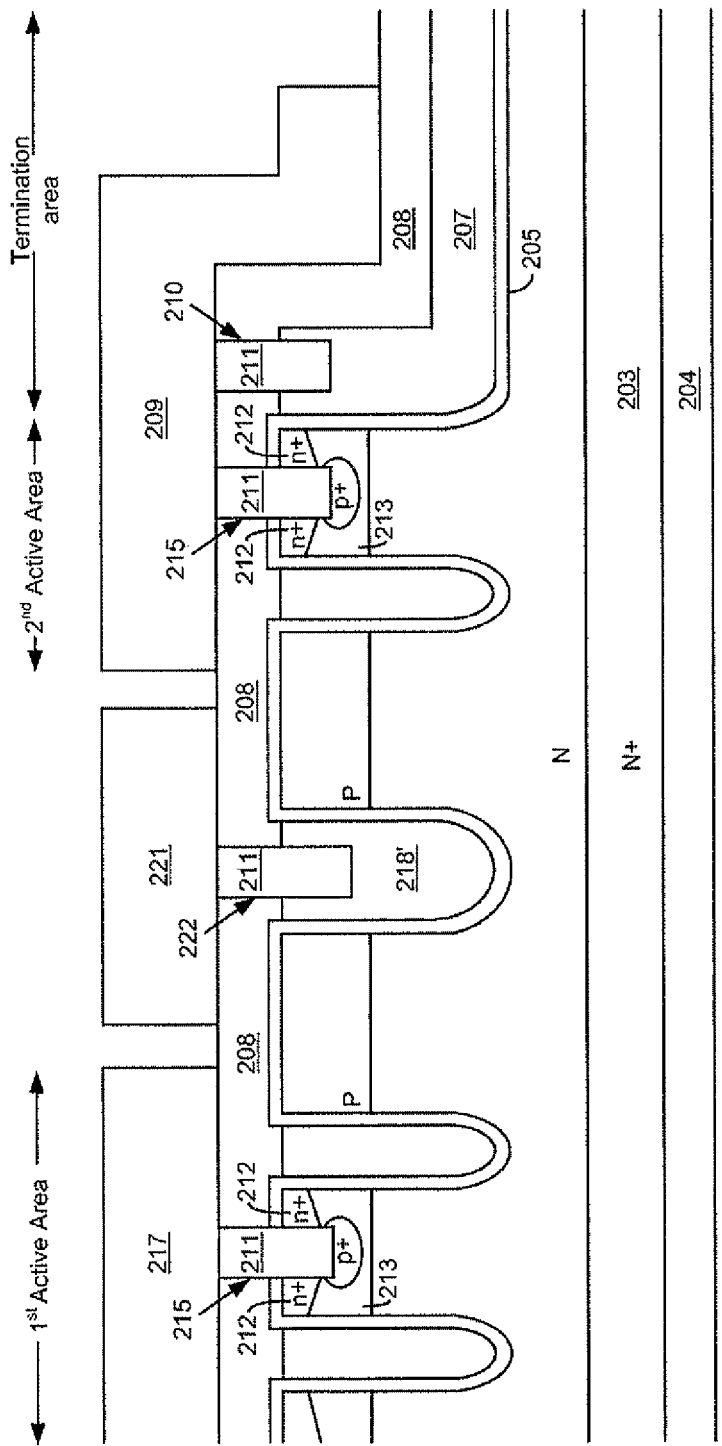

In FIG. 9F, a barrier layer of Ti/TiN or Co/TiN or Ta/TiN and a tungsten metal layer are successively deposited on sidewall and bottom of each of the contact holes and are then etched back to form a contact metal plug 211 respectively for: a trenched field plate contact 210 penetrating through the contact interlayer 208 and extending into the trenched field plate 207; a trenched source-body contact 215 penetrating through the contact interlayer 208, the n+ source regions 212 and extending into the P body regions 213 in the first active area; a trenched gate contact 222 penetrating through the contact interlayer 208 and extending into the wide single electrode 218'; and another trenched source-body contact 215' penetrating through the contact interlayer 208, the n+ source regions 212 and extending into the P body regions 213 in the second active area. Wherein after the deposition of the barrier layer, a step of RTA is selectively performed to form silicide layer. Then, a metal layer of Al alloys or Cu padded by a resistance-reduction layer of Ti or Ti/TiN underneath is deposited onto the contact interlayer 208 and followed by a metal etch process by employing a metal mask (not shown) to be patterned to form a source metal pad 217 which is connected to the n+ source regions 212 and the P body regions 213 in the first active area through the trenched source-body contact 215, a source metal runner 209 which is shorted to the source metal pad 217 and is connected to the trenched field plate 207 through the trenched field plate contact 210, and a gate metal pad 221 which is connected to the wide single electrode 218' through the trenched gate contact 222. Last, a back metal of Ti/Ag/Ni is deposited onto the bottom side of the N+ substrate 203 as a drain metal 204 for drain contact after grinding.

As an alternative to the exemplary embodiment illustrated and described above, the semiconductor power device can also be formed as a trench IGBT. In the case of a trench IGBT, the heavily doped N+ substrate should be replaced by an N+ buffer layer extending over a heavily doped P+ substrate. In this regards, the terminology, such as "source", "body", "drain" should be accordingly replaced by "emitter", "base", "collector".

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A semiconductor power device comprising:
an epitaxial layer of a first conductivity type supported onto a substrate;
a wide termination trench formed in said epitaxial layer in a termination area;
a trenched field plate disposed along inner surface of said wide termination trench and padded with a termination insulating layer, having a L shape or an U shape structure and connected to a source metal runner;
a first active area under a source metal pad, having a plurality of transistor cells and source regions of said first conductivity type;
a second active area near said wide termination trench connected to said first active area and shorted to said source metal runner, having said source regions and at least one stripe transistor cell; wherein
said source regions are formed in an upper portion of body regions of a second conductivity type, each of said source regions having a greater junction depth and a higher doping concentration along sidewalls of a trenched source-body contact than along an adjacent channel region near trenched gates flanked by said source regions at a same distance from a top surface of the epitaxial layer, wherein said trenched source-body contact is filled with a contact metal plug and penetrating through a contact interlayer, said source regions and extending into said body regions to connect said source regions and said body regions in said first and second active areas.

2. The semiconductor power device of claim 1 further comprising at least a connection trenched gate surrounded by said body regions and connected to a gate metal pad for gate contact, wherein said body regions under said gate metal pad have floating voltage.

3. The semiconductor power device of claim 2, wherein said connection trenched gate has a less trench width than said wide termination trench in said termination area but has a greater trench width than said trenched gates in said first and second active areas.

4. The semiconductor power device of claim 1, wherein said first active area comprises a plurality of closed transistor cells and said second active area comprises one stripe transistor cell.

5. The semiconductor power device of claim 1, wherein said first active area comprises a plurality of closed transistor cells, said second active area comprises one stripe transistor cell and a plurality of closed transistor cells.

6. The semiconductor power device of claim 1, wherein said first active area comprises a plurality of stripe transistor cells and said second active area comprises a plurality of stripe transistor cells.

7. The semiconductor power device of claim 1 further comprising an on-resistance reduction region of the first conductivity type surrounding trench bottom of said wide termination trench in said termination area, and surrounding trench bottom of each of said trenched gates in said first and second active areas, wherein said on-resistance reduction area has a higher doping concentration than said epitaxial layer.

8. The semiconductor power device of claim 1, wherein said wide termination trench extends to an edge of said semiconductor power device and said trenched field plate has said L shape structure.

9. The semiconductor power device of claim 1, wherein said wide termination trench extends towards but not to an edge of said semiconductor power device and said trenched field plate has said U shape structure.

10. The semiconductor power device of claim 1, wherein each of said trenched gates in said first and second active areas comprises a single gate electrode padded by a gate oxide layer.

11. The semiconductor power device of claim 10, wherein said gate oxide layer has a thickness along bottom equal to or thinner than along sidewalls of said single gate electrode.

12. The semiconductor power device of claim 10, wherein said gate oxide layer has a greater thickness along bottom than along sidewalls of said single gate electrode.

13. The semiconductor power device of claim 1, wherein each of said trenched gates in said first active area comprises a shielded electrode in a lower portion and a gate electrode in an upper portion, wherein said gate electrode is insulated from said source regions and said body regions by a gate oxide layer, said shielded electrode is insulated from said epitaxial layer by a shielded insulating layer which has a greater thickness than said gate oxide layer, wherein said shielded electrode is insulated from said gate electrode by a inter-poly insulating layer and connected to said source metal pad.

14. The semiconductor power device of claim 13 further comprises a shielded electrode trenched gate for connection of said shielded electrode to said source metal pad, comprising a single shielded electrode formed simultaneously with said shielded electrode and padded by said shielded insulating layer, wherein said single shielded electrode is shorted to said source metal pad through a trenched shielded electrode contact which is filled with said contact metal plug while penetrating through said contact interlayer and extending into said single shielded electrode.

15. The semiconductor power device of claim 1, wherein said trenched field plate is connected to said source metal runner through a trenched field plate contact which is filled with said contact metal plug while penetrating through said contact interlayer and extending into said trenched field plate.

16. The semiconductor power device of claim 1, wherein said trenched field plate is a doped poly-silicon layer.

17. The semiconductor power device of claim 1 is a trench MOSFET.

18. The semiconductor power device of claim 1 is a trench IGBT.

19. A method for manufacturing a semiconductor power device, comprising:
 forming a wide termination trench in a termination area, a plurality of active trenches in first and second active areas and at least a gate connection trench in an epitaxial layer;
 forming an oxide layer on top surface of said epitaxial layer, inner surface of said wide termination trench, said active trenches and said gate connection trench;
 depositing a doped poly-silicon layer;
 carrying out CMP (Chemical Mechanical Polishing) to remove said doped poly-silicon layer from the top surface of said epitaxial layer, leaving said doped poly-silicon layer on inner surface of said wide termination trench including trench sidewalls and trench bottom as a trenched field plate having a L shape or U shape structure, and leaving necessary portion of said doped poly-silicon layer in said active trenches and said gate connection trench to form trenched gates in said first and second active areas and to form a connection trenched gate;
 carrying out body ion implantation to form body regions without requiring a body mask;
 depositing a contact interlayer onto entire top surface;
 applying a contact mask onto said contact interlayer and etching a plurality of contact holes to expose a top surface of said body regions and a top surface of said doped poly-silicon in said connection trenched gate;
 carrying out source ion implantation without requiring a source mask;
 performing source diffusion to form source regions self-aligned to said contact holes in said first and second active areas; and
 carrying out dry silicon etch to form trenched source-body contacts penetrating through said source regions and extending into said body regions.

20. The method of claim 19 wherein said trenched source-body contacts filled with Tungsten plug padded with Ti/TiN layer.

* * * * *